(12) United States Patent
Chang et al.

(10) Patent No.: US 10,741,348 B2
(45) Date of Patent: Aug. 11, 2020

(54) POWER TRANSMISSION APPARATUS

(71) Applicant: RICHTEK TECHNOLOGY CORPORATION, Zhubei, Hsinchu (TW)

(72) Inventors: Wei-Hsu Chang, HsinChu (TW); Ta-Yung Yang, Taoyun (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 200 days.

(21) Appl. No.: 15/871,896

(22) Filed: Jan. 15, 2018

(65) Prior Publication Data

US 2018/0286609 A1    Oct. 4, 2018

Related U.S. Application Data

(60) Provisional application No. 62/479,311, filed on Mar. 30, 2017.

(30) Foreign Application Priority Data

Sep. 18, 2017 (TW) .............................. 106131905 A

(51) Int. Cl.
*H01H 47/00* (2006.01)
*G01R 19/10* (2006.01)
(Continued)

(52) U.S. Cl.
CPC .......... *H01H 47/002* (2013.01); *G01R 19/10* (2013.01); *G01R 31/085* (2013.01); *H02J 1/06* (2013.01);
(Continued)

(58) Field of Classification Search
CPC .... H01H 47/002; H01H 83/16; G01R 31/085; G01R 19/10; H02J 13/0003; H02J 1/06; H02J 7/00
See application file for complete search history.

(56) References Cited

U.S. PATENT DOCUMENTS 5,481,730 A * 1/1996 Brown ...................... G06F 1/26
307/52
5,617,007 A * 4/1997 Keidl .................... H01M 10/44
320/141

(Continued)

FOREIGN PATENT DOCUMENTS

EP        2264855 A2 * 12/2010 ............. G06F 1/266
EP        1595324 B1 * 10/2016 ............. H02J 7/0068
(Continued)

*Primary Examiner* — Pinping Sun
(74) *Attorney, Agent, or Firm* — Tung & Associates

(57) ABSTRACT

A power transmission apparatus includes a power delivery unit generating a power, a load unit receiving the power, a cable, at least a connector, at least a power switch, and a communication interface. The power delivery unit and the load unit is coupled by the connector and the cable, and the power is delivered through the cable and the connector. A voltage threshold is determined according to a delivery current of the power or a load current of the load unit. When a voltage difference between a delivery voltage of the power and a load voltage of the load unit is larger than the voltage threshold, the power switch is turned OFF, wherein information of one of the delivery voltage, the load voltage, the delivery current, and/or the load current is provided through the communication interface.

8 Claims, 11 Drawing Sheets

(51) Int. Cl.
*G01R 31/08* (2020.01)
*H02J 7/00* (2006.01)
*H02J 1/06* (2006.01)
*H02J 13/00* (2006.01)
*H01H 83/16* (2006.01)

(52) U.S. Cl.
CPC ............ *H02J 7/00* (2013.01); *H02J 13/0003* (2013.01); *H01H 83/16* (2013.01)

(56) References Cited

U.S. PATENT DOCUMENTS

| | | | | |
|---|---|---|---|---|
| 5,798,578 | A * | 8/1998 | Thereze | H02H 1/0061 307/18 |
| 5,973,416 | A * | 10/1999 | Guenther | H03K 17/0826 307/125 |
| 6,603,286 | B2 | 8/2003 | Herrmann | H02J 7/0029 320/134 |
| 7,626,362 | B2 * | 12/2009 | Guang | H02J 7/0077 320/135 |
| 7,656,304 | B2 * | 2/2010 | Balakrishnan | G01R 19/16552 340/664 |
| 7,668,975 | B2 * | 2/2010 | McKim, Jr. | G06F 11/273 455/575.1 |
| 7,728,558 | B2 * | 6/2010 | Tam | G06F 1/263 307/80 |
| 8,098,051 | B2 * | 1/2012 | Litingtun | H02J 7/0031 320/134 |
| 8,179,139 | B2 * | 5/2012 | Kawasumi | H01M 2/34 307/46 |
| 8,824,701 | B2 * | 9/2014 | Fortier | H03G 3/001 327/306 |
| 9,293,996 | B2 * | 3/2016 | Djenguerian | H02M 3/33523 |
| 9,392,675 | B2 * | 7/2016 | Taipale | H05B 37/0263 |
| 9,395,208 | B2 * | 7/2016 | Sobotka | G01D 4/002 |
| 9,395,778 | B2 * | 7/2016 | Fritchman | G06F 1/26 |
| 9,590,510 | B1 * | 3/2017 | Sheng | H02M 3/33507 |
| 2003/0071602 | A1 * | 4/2003 | Ando | H02J 1/08 323/282 |
| 2010/0301802 | A1 * | 12/2010 | Iida | B60L 53/305 320/109 |
| 2010/0308777 | A1 * | 12/2010 | Veselic | H02J 7/0068 320/164 |
| 2013/0050880 | A1 * | 2/2013 | Rozman | H02H 3/025 361/18 |
| 2014/0239885 | A1 * | 8/2014 | Yang | H02J 7/0052 320/107 |
| 2014/0336959 | A1 * | 11/2014 | Thomas | G01R 31/08 702/59 |
| 2015/0233976 | A1 * | 8/2015 | Johannesson | G01R 31/085 324/764.01 |
| 2016/0043586 | A1 * | 2/2016 | Wang | H02J 7/0052 320/107 |
| 2016/0056664 | A1 * | 2/2016 | Partovi | H02J 7/025 307/104 |
| 2016/0075251 | A1 * | 3/2016 | Choi | H01H 47/002 320/109 |
| 2016/0241017 | A1 * | 8/2016 | Schroeder | H02H 1/0015 |
| 2016/0329730 | A1 * | 11/2016 | Shiu | H02J 7/0004 |
| 2017/0005513 | A1 * | 1/2017 | Harris | H02J 9/06 |
| 2017/0203850 | A1 * | 7/2017 | Wang | B64C 39/024 |
| 2017/0338642 | A1 * | 11/2017 | Zowislok | H02H 9/002 |
| 2017/0358947 | A1 * | 12/2017 | Waters | H02J 1/00 |
| 2018/0131283 | A1 * | 5/2018 | Ono | G06F 1/26 |
| 2018/0267587 | A1 * | 9/2018 | Aldous | G06F 1/28 |
| 2019/0184849 | A1 * | 6/2019 | Lim | B60L 50/50 |

FOREIGN PATENT DOCUMENTS

| | | | |
|---|---|---|---|
| WO | WO-9637941 A1 * | 11/1996 | ............ H02J 7/0068 |
| WO | WO-2014158739 A1 * | 10/2014 | ............ G11C 7/12 |

* cited by examiner

| Voltage Drop Vdrop | Delivery Current ID or Load Current ILD | Power |
|---|---|---|
| 1V | 1A | 1W |
| 0.5V | 2A | 1W |
| 0.33V | 3A | 1W |
| 0.25V | 4A | 1W |
| 0.2V | 5A | 1W |

Fig. 3

POWER TRANSMISSION APPARATUS

CROSS REFERENCE

The present invention claims priority to U.S. Ser. No. 62/479,311, filed on Mar. 30, 2017 and TW 106131905, filed on Sep. 18, 2017.

BACKGROUND OF THE INVENTION

Field of Invention

The present invention relates to a power transmission apparatus; particularly, it relates to a power transmission apparatus which can detect an abnormal condition of a cable.

Description of Related Art

FIG. 1A shows a prior art power transmission apparatus (power transmission apparatus 1A), wherein the power delivery unit 10 generates power and delivers the power to the load unit 20 through the cable 50 and the connector 40, wherein the cable 50 is integrated as a part of the power delivery unit 10. FIG. 1B shows another prior art power transmission apparatus (power transmission apparatus 1B). The power transmission apparatus 1B is similar to the power transmission apparatus 1A but is different in that the power delivery unit 10 includes a connector 30 and the cable 50 is separable (i.e. can be detached from the power delivery unit 10 and the load unit 20). The power delivery unit 10 is coupled to and delivers power to the load unit 20 through the connector 30, the cable 50 and the connector 40 in the power transmission apparatus 1B. FIG. 1C shows another prior art power transmission apparatus (power transmission apparatus 1C). The power transmission apparatus 1C is similar to the power transmission apparatus 1A and but is different in that the captive cable 50 is integrated as a part of the load unit 20 and the power delivery unit 10 includes a connector 30.

FIG. 1D is a schematic diagram of an equivalent circuit corresponding to FIG. 1B, showing equivalent circuits of the cable 50 and the connectors 30 and 40, wherein Ra and Rb represent equivalent resistances of the connectors 30 and 40 respectively; Rc represents an equivalent resistance of the cable 50; and Rp represents an equivalent resistance of the coupling between the transmission lines (for example a power line and the ground line). Rp should be infinite (i.e. insulated) when the cable is in a normal condition. As the power transmission apparatus is aging, the resistance of the cable or connectors may become larger, that is, Rc, Ra or Rb becomes larger, which causes more power consumption on the cable 50 and the connectors 30 and 40, and the power consumption not only results in extra power loss but also generates heat which may wound a user or even cause fire. Besides, if the cable is peeled off or if there is a foreign object coupled between the transmission lines, Rp may be too small to cause a short circuit current, resulting in damages of the cable or connectors.

A common prior art solution for solving the previous issues is to add a temperature sensor (e.g. a temperature sensitive resistor) on or nearby the cable or the connectors to detect over temperature conditions. However, such a solution increases the cost and size of the apparatus. Furthermore, it is difficult to install a temperature sensor on the cable.

Compared to the prior art solution, the present invention is advantageous in that no temperature sensor is needed since the abnormal condition of the cable is detected by sensing a power difference, a current difference or a voltage difference; the abnormal condition of the cable can be effectively detected with lower cost.

SUMMARY OF THE INVENTION

From one perspective, the present invention provides a power transmission apparatus, comprising: a power delivery unit at a power delivery unit side of the power transmission apparatus, configured to operably generate a power which includes a delivery voltage and provides a delivery current at the power delivery unit side; the power delivery unit including: a delivery control circuit, configured to operably control the delivery voltage and the delivery current; and a delivery voltage sensing circuit, configured to operably sense the delivery voltage and provide corresponding information to the delivery control circuit; a load unit at a load unit side of the power transmission apparatus, coupled to the power delivery unit to receive the power to generate a load current and a load voltage, wherein the power delivery unit and the load unit form a power transmission loop, the load unit including: a load control circuit, configured to operably control the load voltage and/or the load current; and a load voltage sensing circuit, configured to operably sense the load voltage and provide corresponding information to the load control circuit; a connector interface, located on the power transmission loop, and being configured to operably couple the power delivery unit and the load unit and deliver the power; at least a power switch, located on the power transmission loop, and being configured to operably switch the power transmission loop to be conductive or not conductive; at least a current sensing circuit, configured to operably sense the delivery current and/or the load current; and a communication interface, configured to operably communicate between the power delivery unit and the load unit; wherein the delivery control circuit or the load control circuit determines a voltage threshold according to the delivery current or the load current, and determines whether an abnormal condition of the connector interface occurs according to whether a voltage difference between the delivery voltage and the load voltage is larger than the voltage threshold.

In one embodiment, when the voltage difference is larger than the voltage threshold, the delivery control circuit or the load control circuit turns OFF the power switch.

In one embodiment, when the voltage difference is larger than the voltage threshold, the delivery control circuit reduces the delivery voltage and/or the load control circuit reduces the load current.

In one embodiment, when the delivery voltage has been reduced to a minimum voltage level and/or the load current has been reduced to a minimum current level, the delivery control circuit or the load control circuit turns OFF the power switch.

In one embodiment, the delivery control circuit or the load control circuit obtains information of at least one of the delivery voltage, the delivery current, the load voltage or the load current through the communication interface.

From another perspective, the present invention provides a power transmission apparatus, comprising: a power delivery unit at a power delivery unit side of the power transmission apparatus, configured to operably generate a power, wherein the power includes a delivery voltage at the power delivery unit side and the delivery voltage includes a predetermined voltage level; and a load unit at a load unit side of the power transmission apparatus, coupled to the power delivery unit to receive the power to generate a load current and a load voltage, wherein the power delivery unit and the load unit form a power transmission loop, the load unit including: a load control circuit, configured to operably control the load voltage and/or the load current; a load voltage sensing circuit, configured to operably sense the load voltage and provide corresponding information to the load control circuit; a load current sensing circuit, configured to operably sense the load current and provide corresponding information to the load control circuit; a connector interface, located on the power transmission loop, and being configured to operably couple the power delivery unit and the load unit and deliver the power; and a power switch, configured to operably switch the power transmission loop to be conductive or not conductive; wherein the load control circuit determines a voltage threshold according to the load current, and determines whether an abnormal condition of the connector interface occurs according to whether the load voltage is lower than the voltage threshold.

In one embodiment, when the load voltage is lower than the voltage threshold, the load control circuit turns OFF the power switch.

In one embodiment, when the load voltage is lower than the voltage threshold, the load control circuit reduces the load current.

In one embodiment, when the load current has been reduced to a minimum current level, the load control circuit turns OFF the power switch.

From another perspective, the present invention provides a power transmission apparatus, comprising: a power delivery unit at a power delivery unit side of the power transmission apparatus, configured to operably generate a power which includes a delivery voltage and provides a delivery current at the power delivery unit side; the power delivery unit including: a delivery control circuit, configured to operably control the delivery voltage and the delivery current; and a delivery current sensing circuit, configured to operably sense the delivery current and provide corresponding information to the delivery control circuit; a load unit at a load unit side of the power transmission apparatus, coupled to the power delivery unit to receive the power to generate a load current, wherein the power delivery unit and the load unit form a power transmission loop, the load unit including: a load control circuit, configured to operably control the load current; and a load current sensing circuit, configured to operably sense the load current and provide corresponding information to the load control circuit; a connector interface, located on the power transmission loop, and being configured to operably couple the power delivery unit and the load unit and deliver the power; at least a power switch, located on the power transmission loop, and being configured to operably switch the power transmission loop to be conductive or not conductive; at least a current sensing circuit, configured to operably sense the delivery current and/or the load current; and a communication interface, configured to operably communicate between the power delivery unit and the load unit; wherein the delivery control circuit or the load control circuit determines whether an abnormal condition of the connector interface occurs according to whether a current difference between the delivery current and the load current is larger than the a current threshold.

In one embodiment, when the current difference is larger than the current threshold, the delivery control circuit or the load control circuit turns OFF the power switch.

In one embodiment, the delivery control circuit or the load control circuit reads the delivery current and/or the load current through the communication interface.

From another perspective, the present invention provides a power transmission apparatus, comprising: a power delivery unit at a power delivery unit side of the power transmission apparatus, configured to operably generate a power which includes a delivery voltage and provides a delivery current at the power delivery unit side; the power delivery unit including: a delivery control circuit; a delivery current sensing circuit, configured to operably sense the delivery current and provide corresponding information to the delivery control circuit; and a delivery power switch, controlled by the delivery control circuit to control the delivery voltage and/or the delivery current; a load unit at a load unit side of the power transmission apparatus, configured to operably receive the power to generate a load current, wherein the power delivery unit and the load unit form a power transmission loop, including: a load control circuit, configured to operably control the load current; and a load power switch, controlled by the load control circuit to control the load current; and a connector interface, located on the power transmission loop, and being configured to operably couple the power delivery unit and the load unit and deliver the power; wherein when the load power switch is determined to be OFF, whether an abnormal condition of the connector interface occurs is determined according to whether the delivery current is larger than a current threshold.

In one embodiment, when the load power switch is OFF and the delivery current is larger than the current threshold, the delivery control circuit turns OFF the delivery power switch.

In one embodiment, the power transmission apparatus further includes a communication interface configured to operably communicate between the power delivery unit and the load unit, wherein the delivery control circuit and the load control circuit synchronize the time periods in which the load power switch is OFF through the communication interface.

The objectives, technical details, features, and effects of the present invention will be better understood with regard to the detailed description of the embodiments below.

BRIEF DESCRIPTION OF THE DRAWINGS

FIG. 3 shows a table of the delivery current or the load current versus the voltage difference under a certain power.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1A:
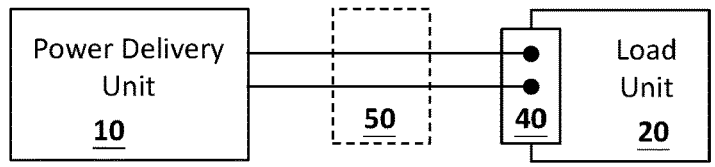
FIGS. 1A-1C show a schematic diagrams of prior art power transmission apparatuses.
Figure 1B:
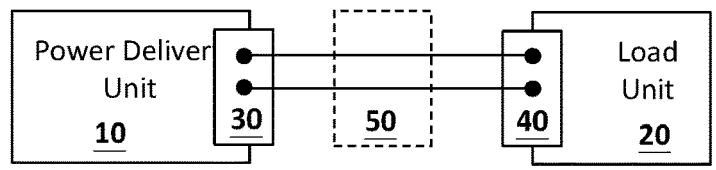
Figure 1C:
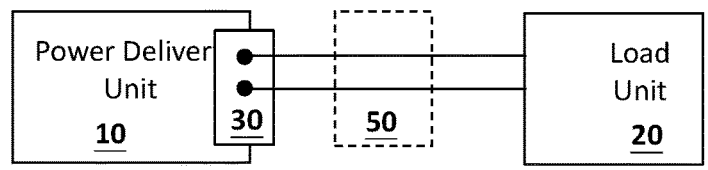
Figure 1D:
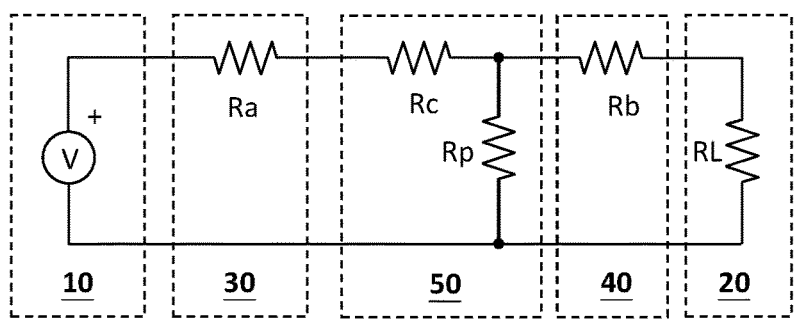
FIG. 1D shows a schematic diagram of an equivalent circuit corresponding to the embodiment of FIG. 1B.
Figure 2:
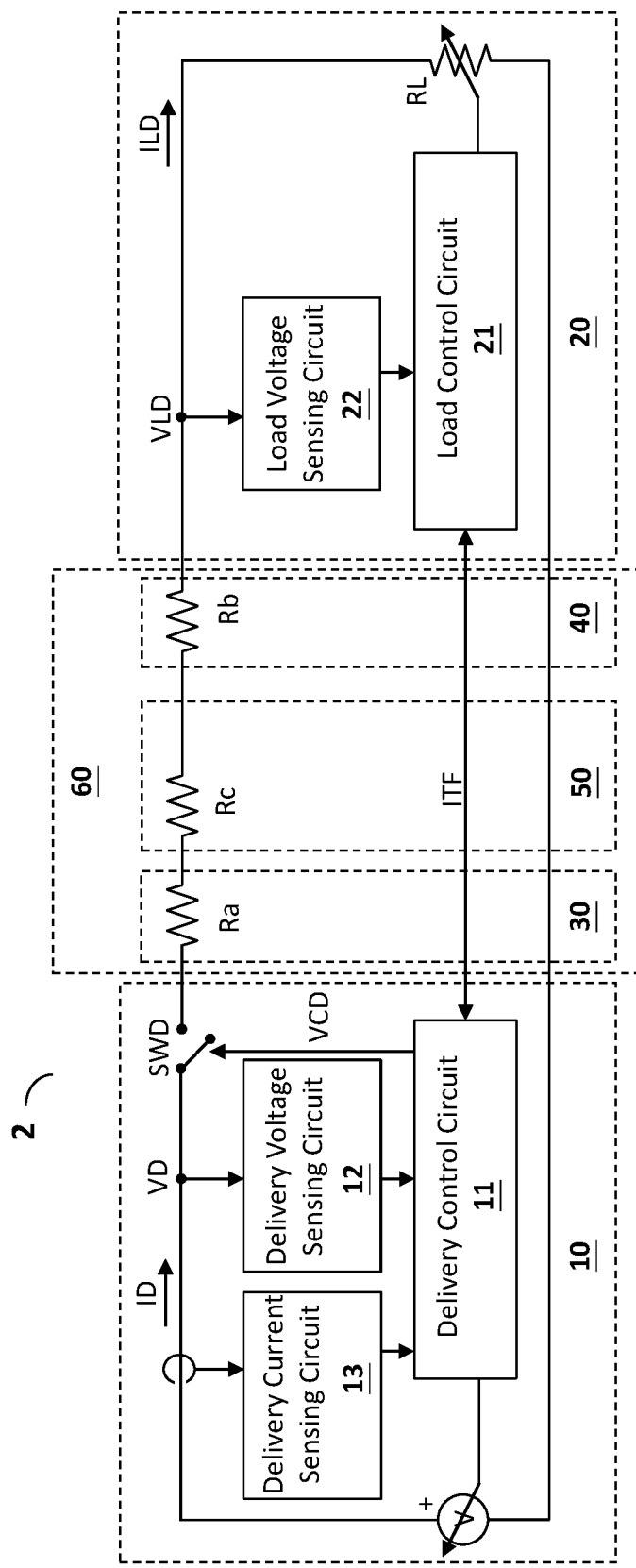
FIG. 2 shows a schematic diagram of an embodiment of the power transmission apparatus according to the present invention.

FIG. 2 shows a schematic diagram of an embodiment of the power transmission apparatus (power transmission apparatus 2) according to the present invention. The power transmission apparatus 2 comprises a power delivery unit 10, a load unit 20, a connection interface 60, a power switch SWD, and at least a current sensing circuit. The interface 60 may include for example but not limited to connectors 30 and 40 (located in the power delivery unit 10 and the load unit 20 respectively) and a cable 50 connected in between. Please also refer to FIG. 6A which shows a flow chart corresponding to the embodiment of the power transmission apparatus in FIG. 2. The power delivery unit 10 generates power (for example as shown by the voltage source in FIG. 2), wherein the power includes a delivery voltage VD and provides a delivery current ID at the power delivery unit side. The delivery current "at the power delivery unit side" indicates a current generated in the delivery unit 10 and flowing on the current loop prior to the cable 50 and the connector 30, that is, the current at the left side of the connector 30 as shown in the figure. The power delivery unit 10 includes a delivery control circuit 11 and a delivery voltage sensing circuit 12. The delivery control circuit 11 controls the delivery voltage VD and the delivery current ID. The delivery voltage sensing circuit 12 senses the delivery voltage VD and provides corresponding information to the delivery control circuit 11. The delivery voltage VD is a voltage on the power delivery unit side and on a node of the current loop prior to the cable 50 and the connector 30. The load unit 20 is coupled to the power delivery unit 10; the load unit 20 receives the power to generate a load current ILD and a load voltage VLD, wherein the power delivery unit 10 and the load unit 20 form a power transmission loop. The load unit 20 may be for example but not limited to a mobile device such as a smart phone, and/or a rechargeable battery thereof. The load unit 20 includes a load control circuit 21 and a load voltage sensing circuit 22. The load control circuit 21 controls the load voltage VLD and the load current ILD, and the load voltage sensing circuit senses the load voltage VLD and provides corresponding information to the load control circuit 21. The load voltage is a voltage on the load unit side and on a node of the current loop posterior to the cable 50 and the connector 40, that is, the voltage at the right side of the connector 40 as shown in the figure. In another embodiment, the delivery voltage sensing circuit and the load voltage sensing circuit 22 can be omitted, and the delivery voltage VD and the load voltage VLD can be directly sensed by the delivery control circuit 11 and the load control circuit 21 respectively, or sensed by other methods. In another embodiment, the interface 60 may be embodied in another form, such as by connectors only (without a cable), or by a cable only, or a cable and one connector only, or by other forms, to connect the power delivery unit 10 and the load unit 20.

More specifically, still referring to FIG. 2, in this embodiment, the cable 50 is coupled to the power delivery unit 10 and the load unit 20 through the connectors 30 and 40 respectively, to deliver power. Note that in another embodiment, the power transmission apparatus of the invention may include only one connector, that is, one of the connectors 30 or 40 may be omitted. In this case, the cable 50 is directly connected to the power delivery unit 10 or the load unit 20 which does not include a connector. In another embodiment, the cable 50 may be omitted, and the power delivery unit 10 and the load unit 20 are coupled to each other through connectors. In one embodiment, the power switch is located in the power transmission loop to control the conduction of the power transmission loop. In the embodiment shown in the figure, the power switch SWD is located in the power delivery unit 10 to switch the power transmission loop to be conductive or not conductive. However, in another embodiment, the power switch may be located in the load unit 20. In the embodiment shown in the figure, the current sensing circuit (the delivery current sensing circuit 13) is located in the power delivery unit 10, and senses the delivery current ILD. The communication interface ITF provides a communication channel between the power delivery unit 10 and the load unit 20. In one embodiment, the communication interface ITF may be located in the cable (e.g. cable 50), and in other embodiments, the communication interface ITF may be located not in the cable, but achieves communication by other contact or non-contact forms.

Figure 6A:
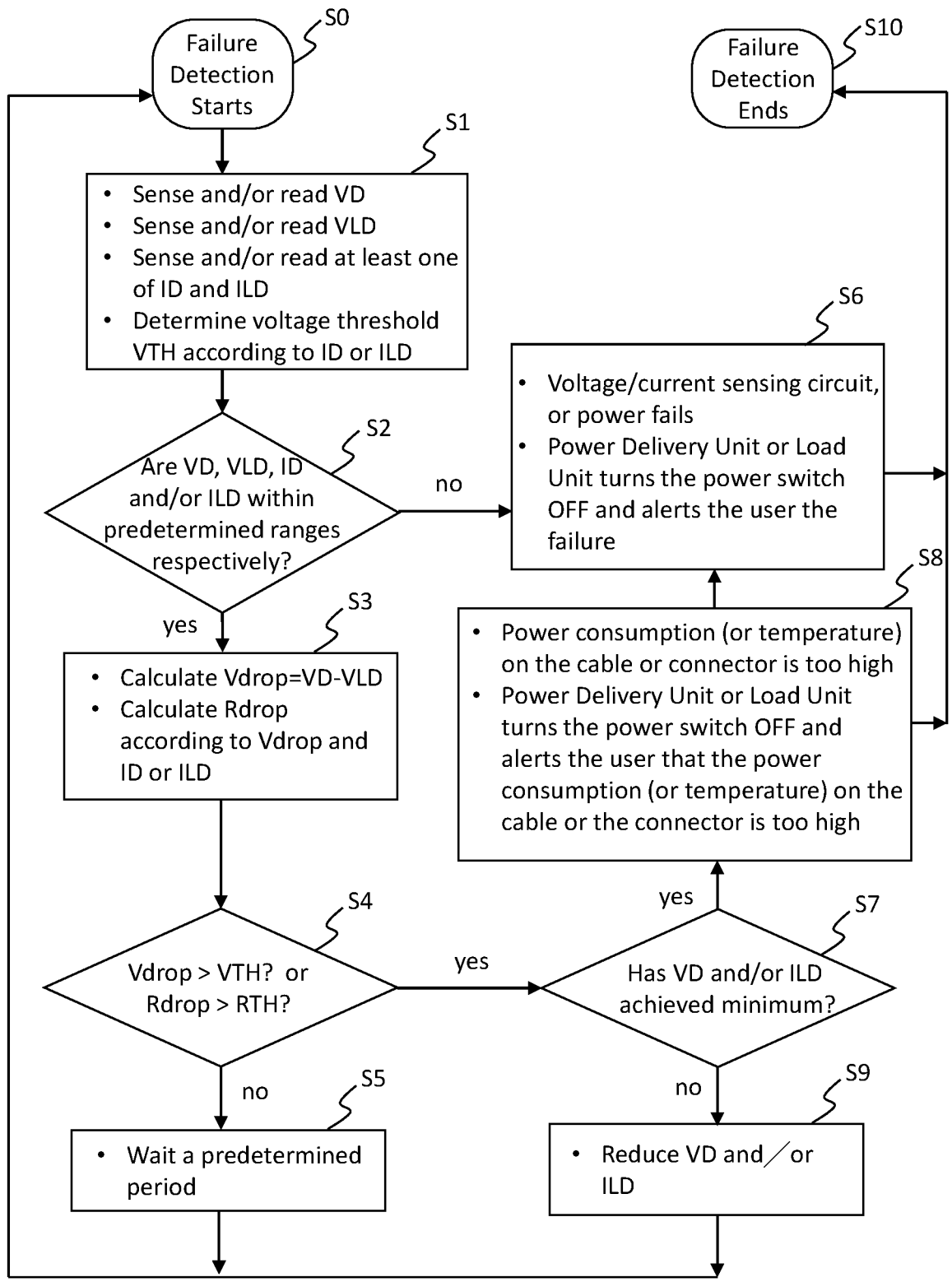
FIG. 6A shows a flow chart corresponding to the embodiment of FIGS. 2, 4 and 5.

Still referring to FIG. 2, the delivery control circuit 11 determines a voltage threshold VTH according to the delivery current, and determines whether an abnormal condition of the cable or the connector (i.e. the connector interface 60) occurs according to whether a voltage difference Vdrop between the delivery voltage VD and the load voltage VLD is larger than the voltage threshold VTH (corresponding to the steps S3 and S4 in FIG. 6A). In one embodiment, the power switch SWD can be turned OFF when an abnormal condition of the connector interface 60 occurs. As an example for setting VTH, VTH=ID*RTH, wherein RTH is an upper limit of Rdrop, wherein Rdrop=Ra+Rb+Rc. And therefore, from one perspective, to determine the abnormal condition can be considered as to determine whether Rdrop is larger than a resistance threshold RTH (corresponding to the steps S3 and S4 in FIG. 6A). In one embodiment, when the voltage difference Vdrop is larger than the voltage threshold VTH (i.e. it is determined that an abnormal condition occurs), the delivery control circuit 11 turns OFF the power switch SWD for example by the control signal VCD, to protect the power transmission apparatus (corresponding to the steps S4 and S8 in FIG. 6A). Besides, as shown in FIG. 6A, in one embodiment, the result of determination (for example, indicating that the voltage difference Vdrop is larger than the voltage threshold VTH) can be provided to the user to alert the user that there is an abnormal condition of the cable and/or the connector. And in one embodiment, before the delivery control circuit 11 turns OFF the power switch SWD, the delivery control circuit 11 may reduce the delivery voltage VD (by for example but not limited to controlling the voltage source in FIG. 2), and/or the load control circuit 21 may reduce the load current ILD (by for example but not limited to controlling the RL in FIG. 2), such that the power consumption on the cable 50 can be reduced (corresponding to the step S9 in FIG. 6A). In one embodiment, after the aforementioned voltage or current reduction steps, when the delivery voltage VD has been reduced to a minimum voltage level and/or the load current ILD has been reduced to a minimum current level, the delivery control circuit 11 turns OFF the power switch SWD to protect the power transmission apparatus (corresponding to the step S8 in FIG. 6A). In other embodiments, other forms of protection operation may be executed when it is determined that an abnormal condition occurs.

In the power transmission apparatus according to the present invention, information regarding at least one of the delivery voltage VD, the delivery current ID, the load voltage VLD or the load current ILD can be provided through the communication interface ITF, for determining the voltage threshold VTH (corresponding to the step S1 in FIG. 6A) or for calculating and determining whether the voltage difference Vdrop between the delivery voltage VD and the load voltage VLD is larger than the voltage threshold (corresponding to the steps S3 and S4 in FIG. 6A). In this embodiment, the delivery control circuit 11 or the load control circuit 21 reads at least one of the delivery voltage VD, the delivery current ID, the load voltage VLD or the load current ILD through the communication interface ITF. In one embodiment, the delivery voltage VD, the delivery current ID, the load voltage VLD or the load current ILD may be converted by an ADC to a digital form, and then delivered through the communication interface ITF. Note that the aforementioned operation may be repeated after a predetermined time interval to continuously detect whether an abnormal condition of the cable and/or the connectors occurs (corresponding to the step S5 in FIG. 6A). Besides, still referring to FIG. 6A, in one embodiment, a pre-diagnosis (steps S2 and S6) can be performed before step S3 to determine whether the delivery voltage VD, the delivery current ID, the load voltage VLD and the load current ILD are within corresponding predetermined ranges respectively. The power switch can be turned OFF (corresponding to the step S6 in FIG. 6A) to protect the power transmission apparatus when one or more of them are not within the predetermined range.

FIG. 3 shows relationship of the delivery current ID or the load current ILD versus the voltage difference Vdrop. As an example, in one embodiment, the power consumption tolerance of the connector interface, i.e. the cable 50 and/or the connectors (connectors 30 and 40) is 1 W, and therefore, the threshold of the voltage difference Vdrop (i.e. the VTH) varies from 1V, 0.5V, . . . 0.2V in correspondence with different delivery current ID or load current ILD (i.e. 1 A, 2 A, . . . 5 A). From another perspective, under a certain current, when the voltage difference Vdrop exceeds the corresponding voltage threshold VTH, it indicates that the power consumption on the cable 50 and/or the connectors exceeds the upper limit 1 W, and hence it is determined that an abnormal condition of the cable and/or the connector occurs (i.e. the resistance of the cable and/or the resistance of the connectors is too high). In one embodiment, the voltage threshold VTH can be calculated according to the power consumption tolerance and the delivery current ID or the load current ILD. And in another embodiment, the voltage threshold VTH can be obtained by a lookup table (for example according to the correspondence between the voltage difference and the current as mentioned above).

Figure 4:
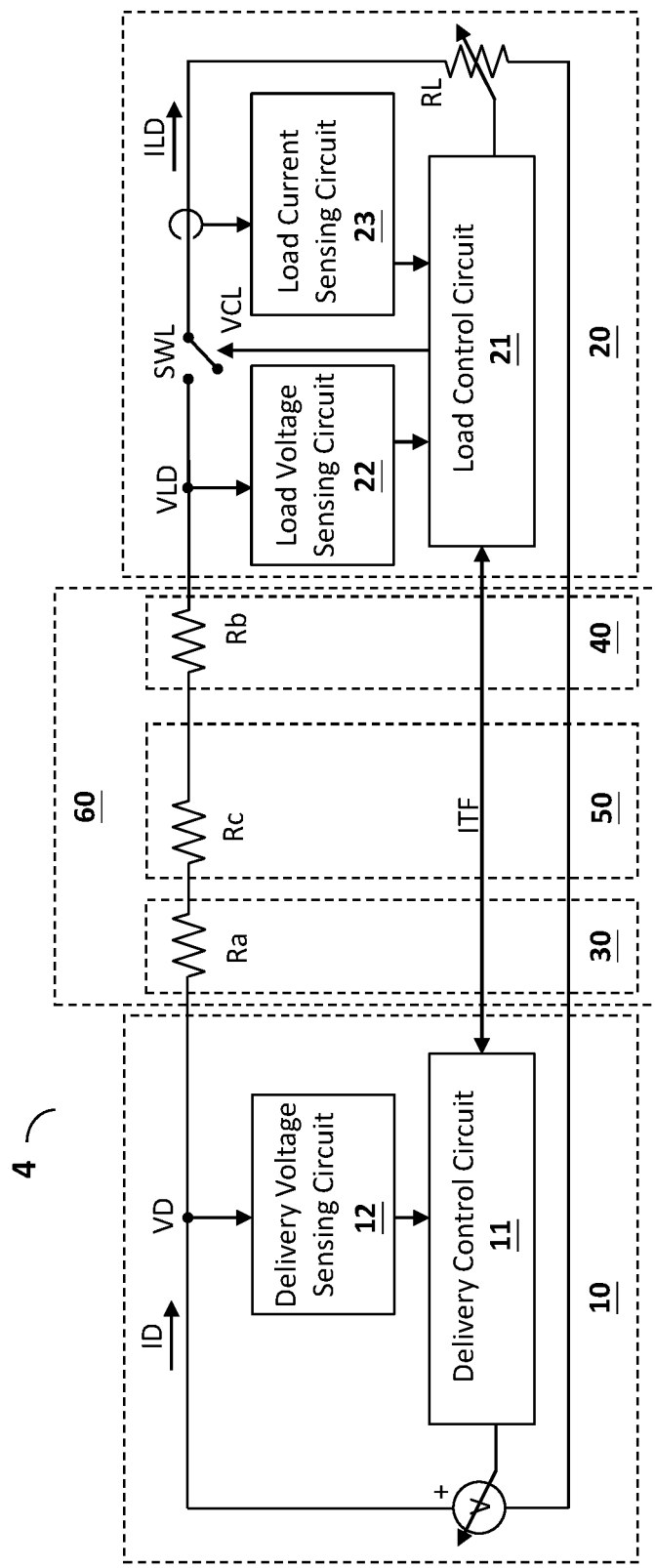
FIG. 4 shows a schematic diagram of an embodiment of the power transmission apparatus according to the present invention.

FIG. 4 shows a schematic diagram of an embodiment of the power transmission apparatus (power transmission apparatus 4) according to the present invention. The power transmission apparatus 4 is similar to the power transmission apparatus 2 shown in FIG. 2, but is different in that in the power transmission apparatus 4, the current sense circuit is located in the load unit 20 (i.e. the load current sensing circuit 23) and senses the load current ILD and provides corresponding information to the load control circuit 21. Besides, in this embodiment, the power switch SWL for controlling the conduction of the power transmission loop is located in the load unit 20 as shown in the figure. In this embodiment, the load control circuit 21 determines the voltage threshold VTH according to the load current ILD, and determines whether an abnormal condition of the cable or the connectors (i.e. the connector interface 60) occurs according to whether the voltage difference Vdrop between the delivery voltage VD and the load voltage VLD is larger than the voltage threshold VTH. In one embodiment, the power switch SWL can be turned OFF (by for example the control signal VCL) when an abnormal condition of the connector interface 60 occurs. In one embodiment, when the voltage difference Vdrop is larger than the voltage threshold VTH (i.e. it is determined that an abnormal condition occurs), the load control circuit 21 turns OFF the power switch SWL. In one embodiment, before the load control circuit 21 turns OFF the power switch SWL, the delivery control circuit 11 may reduce the delivery voltage VD and/or the load control circuit 21 may reduce the load current ILD, such that the power consumption on the cable 50 can be reduced. In one embodiment, after the aforementioned voltage or current reduction steps, when the delivery voltage VD has been reduced to a minimum voltage level and/or the load current ILD has been reduced to a minimum current level, the load control circuit 21 turns OFF the power switch SWL to protect the power transmission apparatus. In this embodiment, the delivery control circuit 11 or the load control circuit 21 may read at least one of the delivery voltage VD, the load current ILD, and/or the load voltage VLD through the communication interface ITF for the calculation or operation mentioned above.

Figure 5:
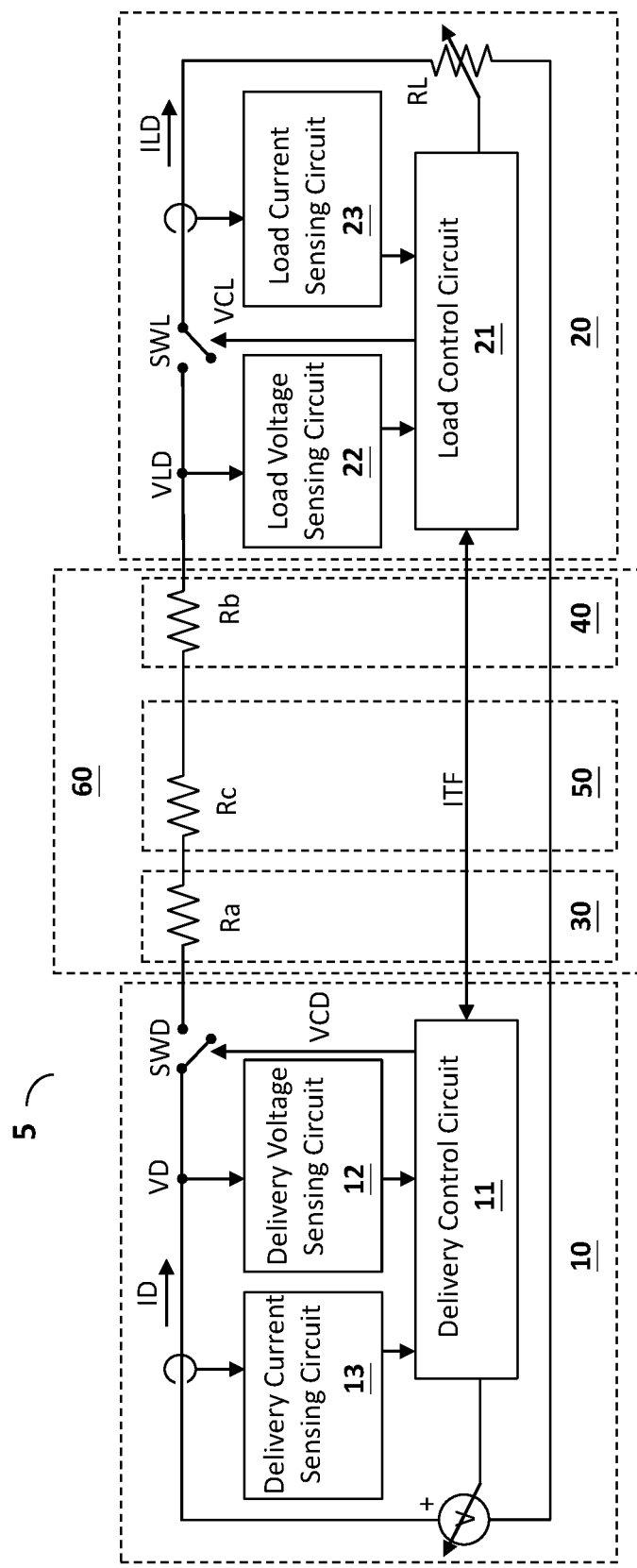
FIG. 5 shows a schematic diagram of an embodiment of the power transmission apparatus according to the present invention.

FIG. 5 shows a schematic diagram of an embodiment of the power transmission apparatus (power transmission apparatus 5) according to the present invention. The power transmission apparatus 5 is similar to the power transmission apparatus 2 shown in FIG. 2, but is different in that in the power transmission apparatus 5, the current sense circuits are located both in the power delivery unit 10 and the load unit 20, i.e. the delivery current sensing circuit 13 and the load current sensing circuit 23, which sense the delivery current ID and the load current ILD respectively and provide corresponding information to the delivery control circuit 11 and the load control circuit 21 respectively. Besides, in this embodiment, two power switches for controlling the conduction of the power transmission loop are located in the power delivery unit 10 and the load unit 20 respectively, as shown in the figure (i.e. power switches SWD and SWL). In this embodiment, the delivery control circuit 11 or the load control circuit 21 determines the voltage threshold VTH according to the delivery current or the load current ILD, and determines whether an abnormal condition of the cable or the connectors (i.e. the connector interface 60) occurs according to whether the voltage difference Vdrop between the delivery voltage VD and the load voltage VLD is larger than the voltage threshold VTH. In one embodiment, the power switches SWD or SWL can be turned OFF when an abnormal condition of the connector interface 60 occurs. In one embodiment, when the voltage difference Vdrop is larger than the voltage threshold VTH, the delivery control circuit 11 turns OFF the power switch SWD. In one embodiment, when the voltage difference Vdrop is larger than the voltage threshold VTH, the load control circuit 21 turns OFF the power switch SWL.

In one embodiment, before the power switch SWL or SWLD is turned OFF, the delivery control circuit 11 may reduce the delivery voltage VD and/or the load control circuit 21 may reduce the load current ILD, such that the power consumption on the cable 50 can be reduced. In one embodiment, after the aforementioned voltage or current reduction steps, when the delivery voltage VD has been reduced to a minimum voltage level and/or the load current ILD has been reduced to a minimum current level, the delivery control circuit 11 turns OFF the power switch SWD and/or the load control circuit 21 turns OFF the power switch SWL to protect the power transmission apparatus. In this embodiment, the delivery control circuit 11 or the load control circuit 21 may read at least one of the delivery voltage VD, the delivery current ID, the load voltage VLD, and/or the load current ILD through the communication interface ITF for the calculation or operation mentioned above.

The aforementioned embodiments (power transmission apparatus 2, 4 and 5) illustrate that, according to the present invention, the power consumption on the cable and the connectors can be directly or indirectly obtained by sensing the voltages and currents at two sides of the cable and the connectors (or other connector interfaces in any other forms); a voltage threshold VTH can be determined according to a predetermined power consumption upper limit of the cable and the connectors; and the delivery current ID or the load current ILD can be compared with a voltage difference Vdrop between the delivery voltage VD and the load voltage VLD to determine whether an abnormal condition of the cable and the connectors (i.e. the connector interface) occurs, which can be followed by a protection operation such as reducing voltages or currents or turning OFF the power switch. FIG. 6A shows the operation flow chart which has been explained with reference to the power transmission apparatus 4 and 5, and is not repeated here.

Figure 6B:
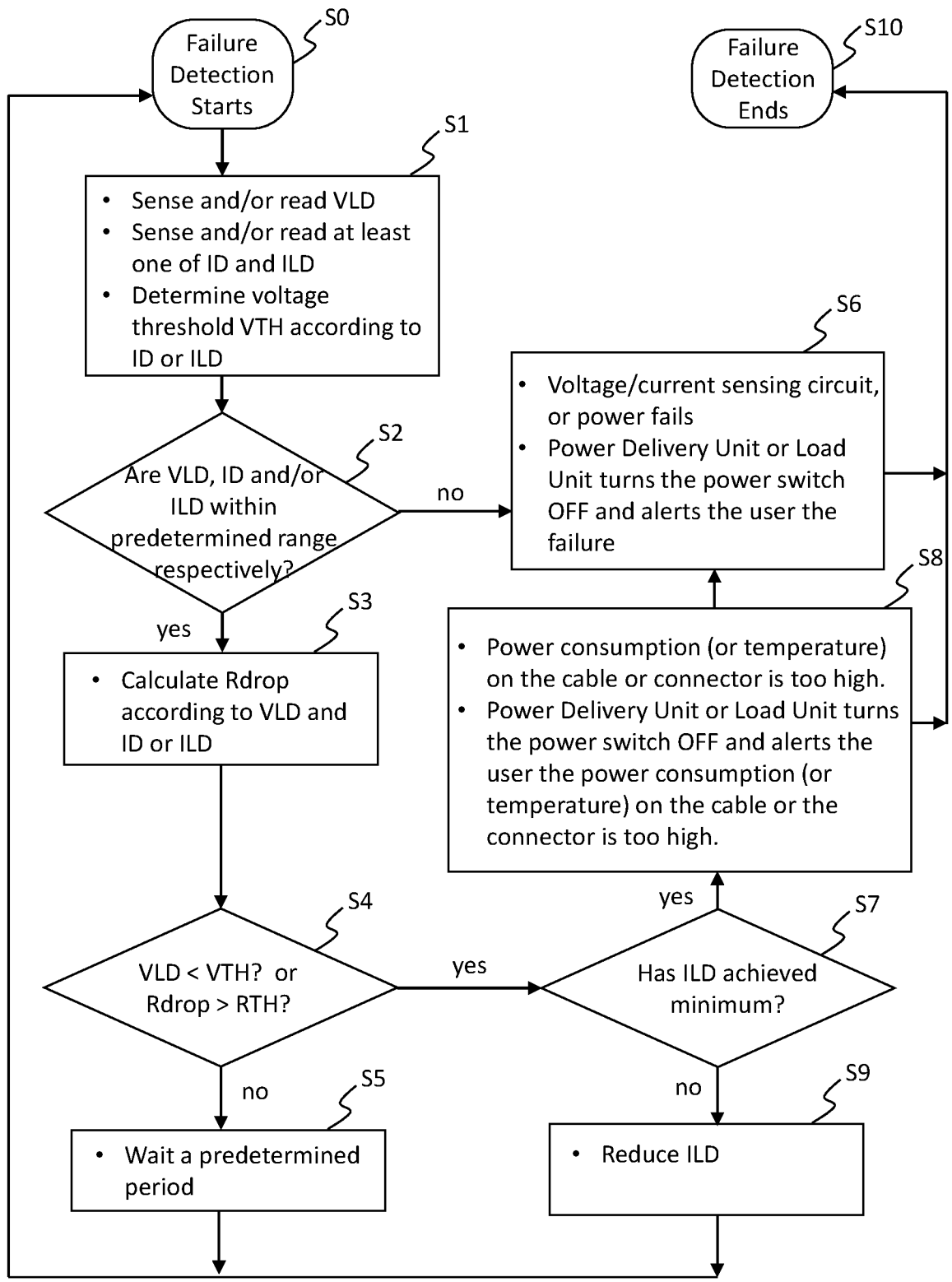
FIG. 6B shows a flow chart corresponding to the embodiment of FIG. 7.
Figure 7:
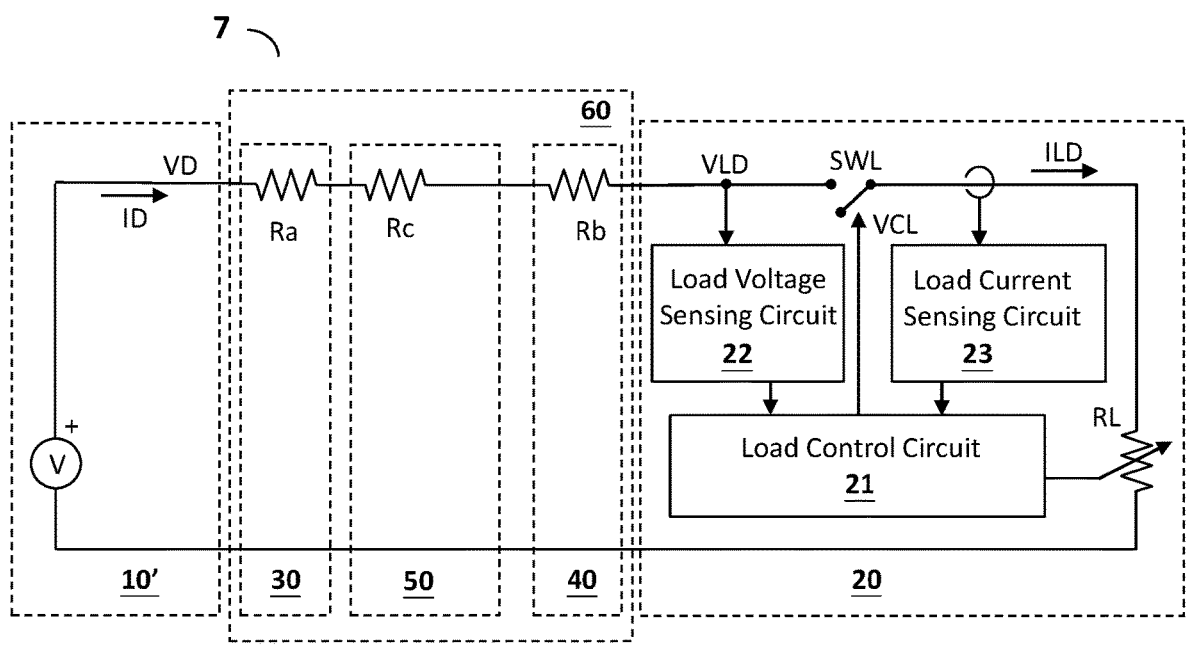
FIG. 7 shows a schematic diagram of an embodiment of the power transmission apparatus according to the present invention.

In some cases, it may not be possible to communicate between the power delivery unit and the load unit, for example when the power delivery unit is a conventional power adaptor with fixed output voltage, and hence the power delivery unit cannot sense the delivery voltage or the delivery current in a real time base and cannot exchange information with the load unit through the communication interface. However, according to the spirit of the present invention, an abnormal condition of the cable and the connectors can still be detected in this case. Referring to FIG. 7 which shows a schematic diagram of an embodiment of the power transmission apparatus (power transmission apparatus 7) according to the present invention. Also referring to FIG. 6B which shows a flow chart corresponding to the embodiment of the power transmission apparatus shown in FIG. 7. The power transmission apparatus 7 is similar to the power transmission apparatus 4 shown in FIG. 4, but is different in that in the power transmission apparatus 7, the power delivery unit 10' does not communicate with the load unit 20. However in this case, the delivery voltage VD of the power delivery unit 10' has a predetermined voltage level VL, wherein the "predetermined" voltage level may be fixed value (for example but not limited to 5V) or an adjustable variable (i.e., a "predetermined" number can be a constant or a controlled variable, the same for other uses of the term "predetermined" throughout the text). In this embodiment, the current sensing circuit is located in the load unit 20 (i.e. the load current sensing circuit 23), which senses the load current ILD. Besides, in this embodiment, the power switch SWL for controlling the conduction of the power transmission loop is located in the load unit 20 as shown in the figure. The load control circuit 21 determines the voltage threshold VTH according to the load current ILD, and determines whether an abnormal condition of the cable or the connector (i.e. the connector interface 60) occurs according to whether the load voltage VLD is lower than the voltage threshold VTH' (corresponding to the steps S3 and S4 in FIG. 6B). In one embodiment, the power switch SWL can be turned OFF when an abnormal condition of the connector interface 60 occurs. The voltage threshold relates to the predetermined voltage level VL. As an example, VTH' can be set as VTH'=VL−ILD*RTH, wherein RTH is an upper limit of Rdrop, wherein Rdrop=Ra+Rb+Rc. And therefore, from one perspective, to determine the abnormal condition can be considered as to determine whether Rdrop is larger than the resistance threshold RTH (corresponding to the steps S3 and S4 in FIG. 6B). In one embodiment, when the load voltage VLD is lower than the voltage threshold VTH' (i.e. it is determined that an abnormal condition occurs), the load control circuit 21 turns OFF the power switch SWL to protect the power transmission apparatus (corresponding to the steps S4 and S8 in FIG. 6B). Besides, as shown in FIG. 6B, in one embodiment, the result of determination (for example the load voltage VLD is lower than the voltage threshold VTH') can be provided to the user to alert the user that there is an abnormal condition of the cable and/or the connector. And in one embodiment, before the load control circuit 21 turns OFF the power switch SWL, the load control circuit 21 may reduce the load current ILD, such that the power consumption on the cable 50 can be reduced (corresponding to the step S9 in FIG. 6B). In one embodiment, after the aforementioned current reduction steps (corresponding to the step S7 in FIG. 6B), when the load current ILD has been reduced to a minimum current level, the load control circuit 21 turns OFF the power switch SWL to protect the power transmission apparatus (corresponding to the step S8 in FIG. 6B).

As described earlier, another common abnormal condition of the cable and the connectors is that an extra current path is formed between transmission lines or contacts. In this case, the abnormal condition can still be detected by a current difference between the delivery current and the load current according to the present invention.

Figure 8:
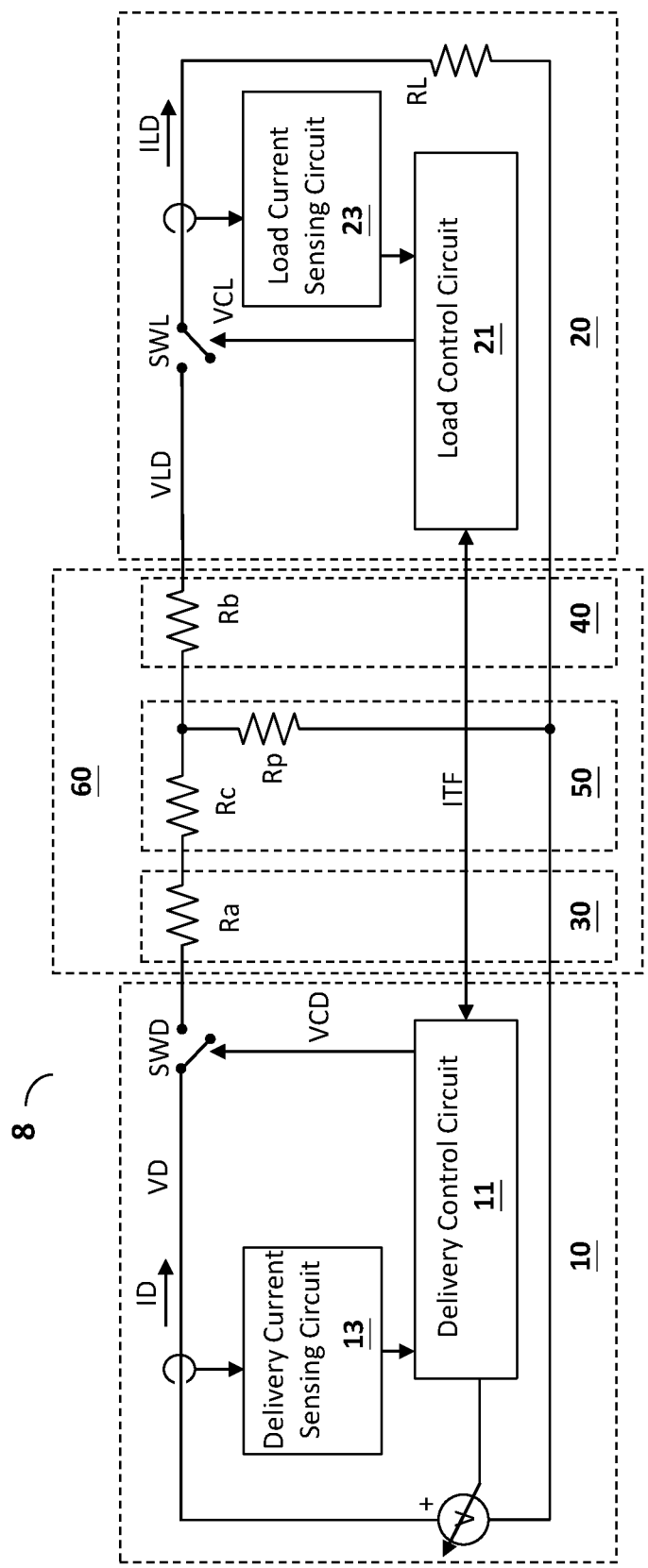
FIG. 8 shows a schematic diagram of an embodiment of the power transmission apparatus according to the present invention.
Figure 10:
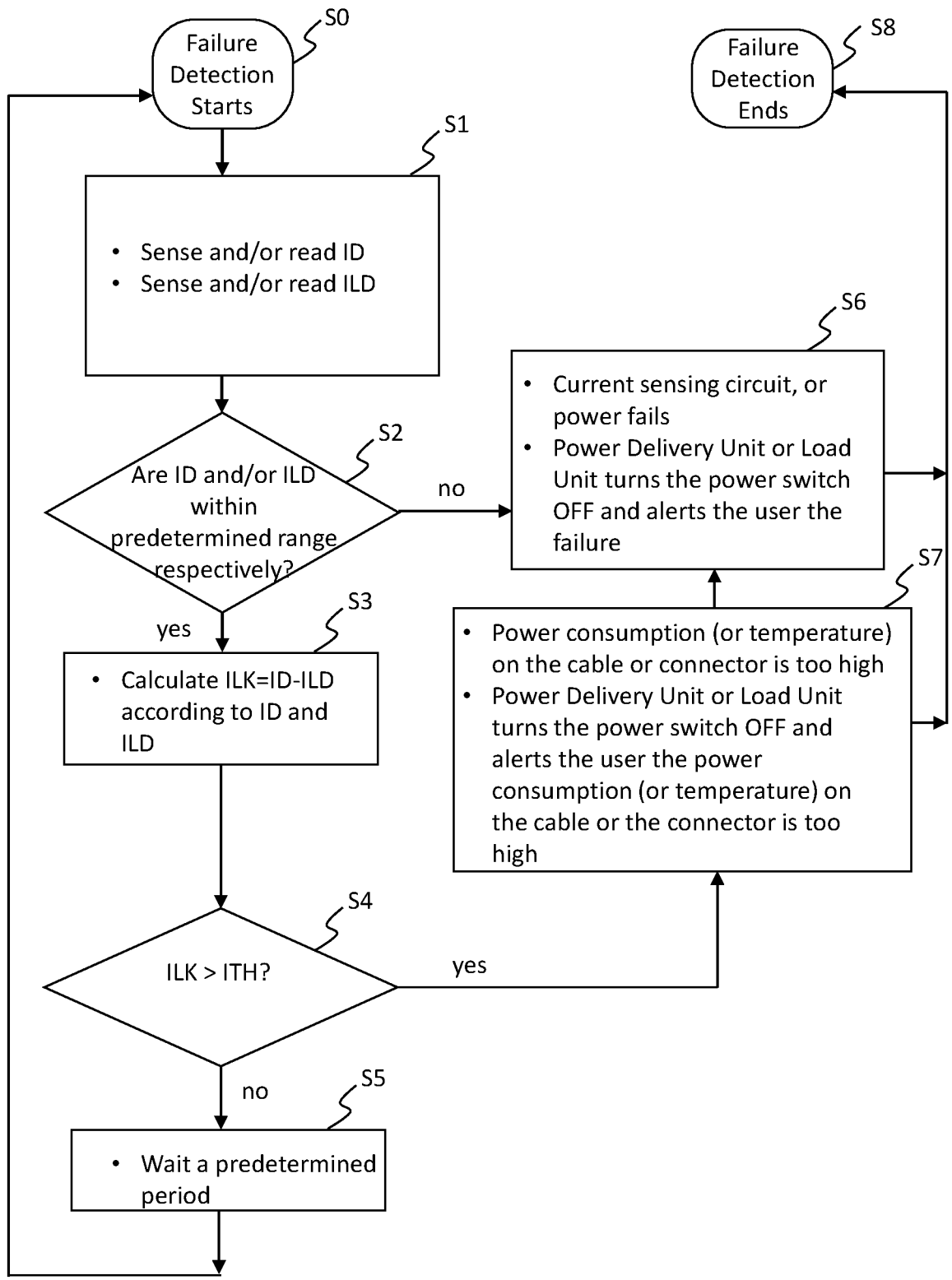
FIG. 10 shows a flow chart corresponding to the embodiment of FIG. 8.

FIG. 8 shows a schematic diagram of an embodiment of the power transmission apparatus (power transmission apparatus 8) according to the present invention. Please also refer to FIG. 10 which shows an operation flowchart corresponding to the embodiment of the power transmission apparatus in FIG. 8 according to the present invention. The power transmission apparatus 8 is similar to the power transmission apparatus 5 shown in FIG. 5, but is different in that in the power transmission apparatus 8, the delivery voltage sensing circuit and the load voltage sensing circuit may be omitted. In this embodiment, the current sense circuits are located both in the power delivery unit 10 and the load unit 20, i.e. the delivery current sensing circuit 13 and the load current sensing circuit 23, which sense the delivery current ID and the load current ILD respectively and provide corresponding information to the delivery control circuit 11 and the load control circuit 21 respectively. Besides, in this embodiment, two power switches for controlling the conduction of the power transmission loop are located in the power delivery unit 10 and the load unit 20 respectively, as shown in the figure (i.e. power switches SWD and SWL). In this embodiment, the delivery control circuit 11 or the load control circuit 21 determines whether an abnormal condition of the cable or the connectors (i.e. the connector interface 60) occurs according to whether a current difference ILK between the delivery current ID and the load current ILD is larger than a current threshold ITH (corresponding to steps S3 and S4 in FIG. 10). In one embodiment, the power switches SWD or SWL can be turned OFF when an abnormal condition of the connector interface 60 occurs (corresponding to steps S4 and S7 in FIG. 10) to protect the power transmission apparatus. In one embodiment, the current threshold ITH may be for example 50 mA. In one embodiment, when the current difference ILK is larger than the current threshold ITH, the delivery control circuit 11 turns OFF the power switch SWD to protect the power transmission apparatus. In one embodiment, when the current difference ILK is larger than the current threshold ITH, the load control circuit 21 turns OFF the power switch SWL to protect the power transmission apparatus. In this embodiment, the delivery control circuit 11 or the load control circuit 21 may read the delivery current ID and/or the load current ILD through the communication interface ITF for the calculation or operation as mentioned above.

Figure 9:
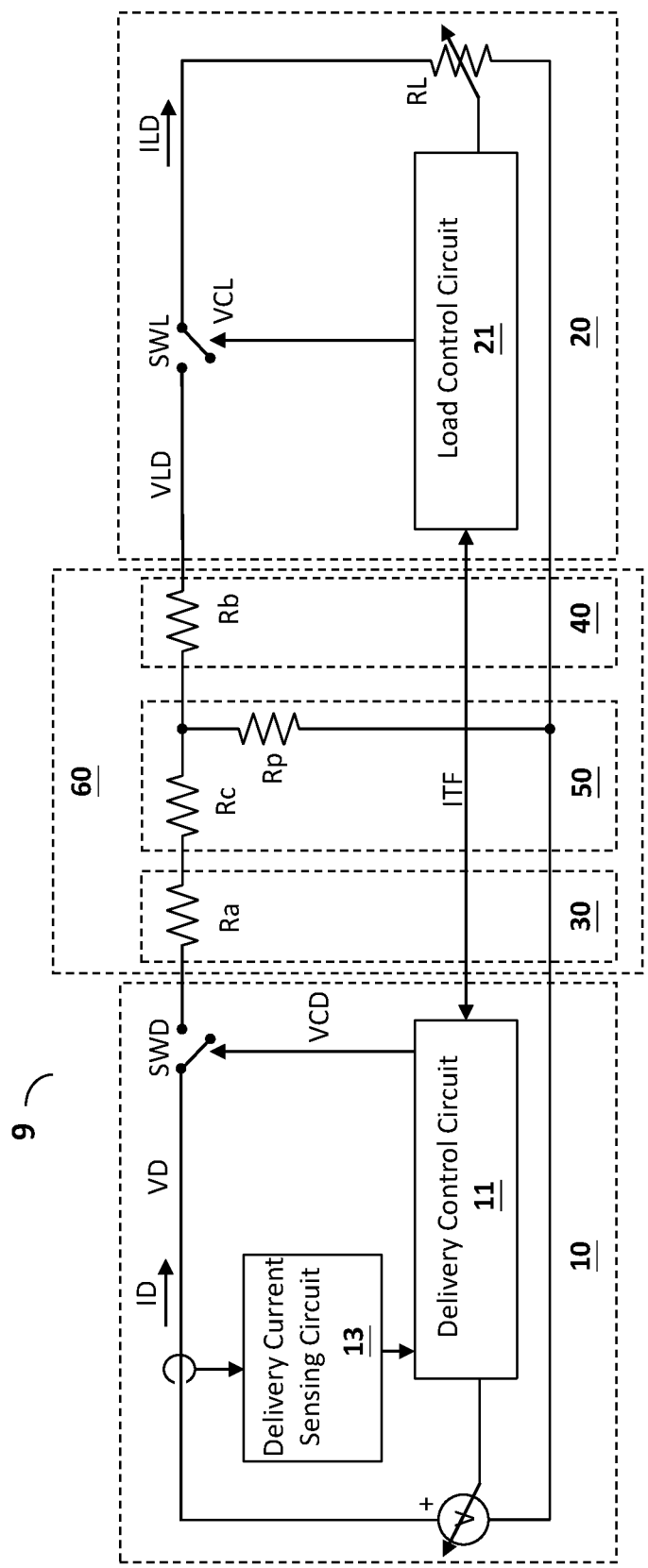
FIG. 9 shows a schematic diagram of an embodiment of the power transmission apparatus according to the present invention.

FIG. 9 shows a schematic diagram of an embodiment of the power transmission apparatus (power transmission apparatus 9) according to the present invention. The power transmission apparatus 9 is similar to the power transmission apparatus 8 shown in FIG. 8, but is different in that in the power transmission apparatus 9, the load current sensing circuit may be omitted. In this embodiment, the load control circuit 21 controls the load current ILD to substantially be zero, and at the same time, the delivery control circuit 11 determines whether an abnormal condition of the cable or the connectors (i.e. the connector interface 60) occurs according to whether the delivery current ID is larger than a current threshold ITH. In one embodiment, the power switch SWD can be turned OFF when an abnormal condition of the connector interface 60 occurs to protect the power transmission apparatus. In one embodiment, the load control circuit 21 turns OFF the load power switch SWL to control the load current ILD to substantially be zero for determining whether an abnormal condition occurs as described above. Note that in other embodiments, during time periods when the load power switch SWL is not controlled OFF by the load control circuit 21, or is OFF by other causes, the aforementioned abnormal condition detection can still be performed. In one embodiment, the load power switch SWL may be omitted. In this case, the load control circuit 21 may control for example the load RL to control the load current ILD to substantially be zero. More specifically, since the load current ILD is controlled to substantially be 0 (for example when the load power switch SWL is OFF, or by controlling the load RL) that the delivery current ID is larger than a current threshold ITH at this moment indicates an abnormal condition caused by a short circuit or a foreign object between the cable or the connectors, so the abnormal condition of the cable 50 or the connectors 30 and 40 can still be detected without the load current sensing circuit in this embodiment. In one embodiment, when the load current ILD is controlled to substantially be 0 (for example by turning the load power switch SWL OFF) and the delivery current ID is larger than a current threshold ITH, the delivery control circuit 11 turns OFF the power switch SWD to protect the power transmission apparatus. In one embodiment, the delivery control circuit 11 and the load control circuit 21 synchronize the time periods in which the load current ILD is controlled to substantially be 0 (for example when the load power switch SWL is turned OFF) through the communication interface ITF. Also note that, it is not for limiting the scope of the present invention to control the load current ILD substantially be zero for determining an abnormal condition. In one embodiment, the load control circuit 21 may control the load current ILD to a predetermined current level (for example a minimum current level) other than zero, and since the predetermined current level is a known value, the delivery control circuit 11 still can determine whether an abnormal condition of the cable or the connectors (i.e. the connector interface 60) occurs according to whether the delivery current ID is larger than a current threshold ITH.

Note that the load current ILD is controlled to "substantially" be 0 means that the load current ILD may not be exactly zero. According to the present invention, it is tolerable for a certain level of error of the load current ILD from zero due to for example non-ideality of circuitry.

The aforementioned embodiments illustrate that, according to the present invention, protection operations can be performed when the power consumption on the cable and the connectors (i.e. the connector interface) is too high to prevent over temperature from damaging the cable and the connectors, without requiring a temperature sensor.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, the "according to a voltage difference between the delivery voltage and the load voltage" and the "according to a current difference between the delivery current and the load current" can be used together, such that the power transmission apparatus can sense these two electrical parameters for detecting various kinds of abnormal conditions of the cable and connectors. Furthermore, those skilled in this art can readily conceive variations and modifications within the spirit of the present invention. For example, controlling the power switch and sensing the voltages or currents and calculations thereof can be performed by different units. Taking the embodiment of FIG. 2 as an example, the power switch may be located in the load unit, and after the delivery control circuit 11 reads the load voltage VLD through the communication interface ITF, the delivery control circuit 11 can notify the load control circuit 21 also through the communication interface ITF to control the power switch. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:
1. A power transmission apparatus, comprising:
 a power delivery circuit at a power delivery circuit side of the power transmission apparatus, configured to operably generate a power, wherein the power includes a delivery voltage at the power delivery circuit side and the delivery voltage includes a predetermined voltage level; and a load circuit at a load circuit side of the power transmission apparatus, coupled to the power delivery circuit to receive the power to generate a load current and a load voltage, wherein the power delivery circuit and the load circuit form a power transmission loop, the load circuit including:
- a load control circuit, configured to operably control the load voltage and/or the load current;
- a load voltage sensing circuit, configured to operably sense the load voltage and provide corresponding information to the load control circuit;
- a load current sensing circuit, configured to operably sense the load current and provide corresponding information to the load control circuit;
- a connector interface circuit, located on the power transmission loop, and being configured to operably couple the power delivery circuit and the load circuit and deliver the power; and
- a power switch, configured to operably switch the power transmission loop to be conductive or not conductive;

wherein the load control circuit determines a voltage threshold according to the load current sensed by the load current sensing circuit, and determines whether an abnormal condition of the connector interface circuit occurs according to whether the load voltage is lower than the voltage threshold.

2. The power transmission apparatus of claim 1, wherein when the load voltage is lower than the voltage threshold, the load control circuit turns OFF the power switch.

3. The power transmission apparatus of claim 1, wherein when the load voltage is lower than the voltage threshold, the load control circuit reduces the load current.

4. The power transmission apparatus of claim 3, wherein when the load current has been reduced to a minimum current level by the load control circuit, the load control circuit turns OFF the power switch.

5. A power transmission apparatus, comprising:
a power delivery circuit at a power delivery circuit side of the power transmission apparatus, configured to operably generate a power which includes a delivery voltage and provides a delivery current at the power delivery circuit side; the power delivery circuit including:
- a delivery control circuit;
- a delivery current sensing circuit, configured to operably sense the delivery current and provide corresponding information to the delivery control circuit; and
- a delivery power switch, controlled by the delivery control circuit to control the delivery voltage and/or the delivery current;

a load circuit at a load circuit side of the power transmission apparatus, configured to operably receive the power to generate a load current, wherein the power delivery circuit and the load circuit form a power transmission loop, including:
- a load control circuit, configured to operably control the load current; and
- a connector interface circuit, located on the power transmission loop, and being configured to operably couple the power delivery circuit and the load circuit and deliver the power;

wherein when the load control circuit controls the load current to substantially be a predetermined current level, whether an abnormal condition of the connector interface circuit occurs is determined according to whether the delivery current is larger than a current threshold which is related to the predetermined current level, wherein the predetermined current level is a known value.

6. The power transmission apparatus of claim 5, wherein the load circuit further includes a load power switch, wherein the load control circuit turns the load power switch to be OFF to determine whether the abnormal condition occurs, wherein the load power switch being turned OFF corresponds to the predetermined current level being zero.

7. The power transmission apparatus of claim 5, wherein when the load current is controlled to substantially be the predetermined level and the delivery current is larger than the current threshold, the delivery control circuit turns OFF the delivery power switch.

8. The power transmission apparatus of claim 5, further including a communication interface circuit configured to operably communicate between the power delivery circuit and the load circuit, wherein the delivery control circuit and the load control circuit synchronize the time periods in which the load current is controlled to substantially be the predetermined level through the communication interface circuit and in which the delivery control circuit determines whether the delivery current is larger than the current threshold.

* * * * *